United States Patent
Then et al.

(10) Patent No.: US 11,587,862 B2
(45) Date of Patent: Feb. 21, 2023

(54) MICROELECTRONIC DEVICES HAVING AIR GAP STRUCTURES INTEGRATED WITH INTERCONNECT FOR REDUCED PARASITIC CAPACITANCES

(71) Applicant: Tahoe Research, Ltd., Dublin (IE)

(72) Inventors: Han Wui Then, Portland, OR (US); Sansaptak Dasgupta, Hillsboro, OR (US); Marko Radosavljevic, Portland, OR (US); Sanaz K. Gardner, Hillsboro, OR (US)

(73) Assignee: Tahoe Research, Ltd., Dublin (IE)

( * ) Notice: Subject to any disclaimer, the term of this patent is extended or adjusted under 35 U.S.C. 154(b) by 0 days.

(21) Appl. No.: 17/202,281

(22) Filed: Mar. 15, 2021

(65) Prior Publication Data

US 2021/0202374 A1     Jul. 1, 2021

Related U.S. Application Data

(62) Division of application No. 16/462,889, filed as application No. PCT/US2016/069620 on Dec. 30, 2016, now Pat. No. 10,998,260.

(51) Int. Cl.
| | |
|---|---|
| *H01L 29/40* | (2006.01) |
| *H01L 23/48* | (2006.01) |
| *H01L 23/52* | (2006.01) |
| *H01L 23/522* | (2006.01) |
| *H01L 21/762* | (2006.01) |
| *H01L 21/764* | (2006.01) |
| *H01L 21/768* | (2006.01) |
| *H01L 29/06* | (2006.01) |
| *H01L 23/532* | (2006.01) |

(52) U.S. Cl.
CPC ........ *H01L 23/5222* (2013.01); *H01L 21/762* (2013.01); *H01L 21/764* (2013.01); *H01L 21/7682* (2013.01); *H01L 23/53295* (2013.01); *H01L 29/0649* (2013.01)

(58) Field of Classification Search
CPC . H01L 23/5222; H01L 21/762; H01L 21/764; H01L 21/7682; H01L 23/53295; H01L 29/0649
USPC .......................................................... 257/734
See application file for complete search history.

(56) References Cited

U.S. PATENT DOCUMENTS

| | | |
|---|---|---|
| 2003/0127740 A1 | 7/2003 | Hsu et al. |
| 2004/0097065 A1 | 5/2004 | Lur |
| 2009/0093100 A1* | 4/2009 | Xia .................. H01L 21/76807 438/421 |
| 2010/0140739 A1 | 6/2010 | Kim |

(Continued)

OTHER PUBLICATIONS

International Search Report and Written Opinion for International Patent Application No. PCT/US2016/069620, dated Jul. 11, 2019, 11 paqes.

(Continued)

*Primary Examiner* — Theresa T Doan
(74) *Attorney, Agent, or Firm* — Studebaker & Brackett PC

(57) ABSTRACT

Embodiments of the invention include a microelectronic device that includes a substrate, at least one dielectric layer on the substrate and a plurality of conductive lines within the at least one dielectric layer. The microelectronic device also includes an air gap structure that is located below two or more of the plurality of conductive lines.

7 Claims, 5 Drawing Sheets

(56) References Cited

U.S. PATENT DOCUMENTS

2012/0037962 A1    2/2012  Breyta et al.

OTHER PUBLICATIONS

International Search Report and Written Opinion for International Patent Application No. PCT/US2016/069620 dated Sep. 28, 2017, 12 pgs.

* cited by examiner

MICROELECTRONIC DEVICES HAVING AIR GAP STRUCTURES INTEGRATED WITH INTERCONNECT FOR REDUCED PARASITIC CAPACITANCES

CROSS-REFERENCE TO RELATED APPLICATIONS

This patent application is a Divisional of U.S. patent application Ser. No. 16/462,889, filed May 21, 2019, which is a U.S. National Phase application under 35 U.S.C. § 371 of International Application No. PCT/US2016/069620, filed Dec. 30, 2016, entitled "MICROELECTRONIC DEVICES HAVING AIR GAP STRUCTURES INTEGRATED WITH INTERCONNECT FOR REDUCED PARASITIC CAPACITANCES," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having air gap structures integrated with interconnect structures for reduced parasitic capacitances.

BACKGROUND OF THE INVENTION

The current state of the art for semiconductor material interconnects is copper (Cu) conductive layers and low-k (low dielectric constant) ILD (inter-layer dielectric) films. A first metal layer routing incurs a largest parasitic capacitance between the metal transmission lines of the first metal layer and a substrate due to the close distance between the metal lines of the first metal layer and the substrate. A capacitance Cline between metal lines can be significantly less than the capacitance Csub between the metal lines of the first metal layer and the substrate.

Another prior art approach is silicon on insulator (SOI) technology that uses a layered silicon-insulator-silicon substrate in place of conventional silicon substrates in semiconductor manufacturing to reduce parasitic device capacitance. However, SOI technology is more complex and expensive to manufacture in comparison to a conventional silicon substrate and interconnect structure.

DETAILED DESCRIPTION OF THE INVENTION

Figure 1:
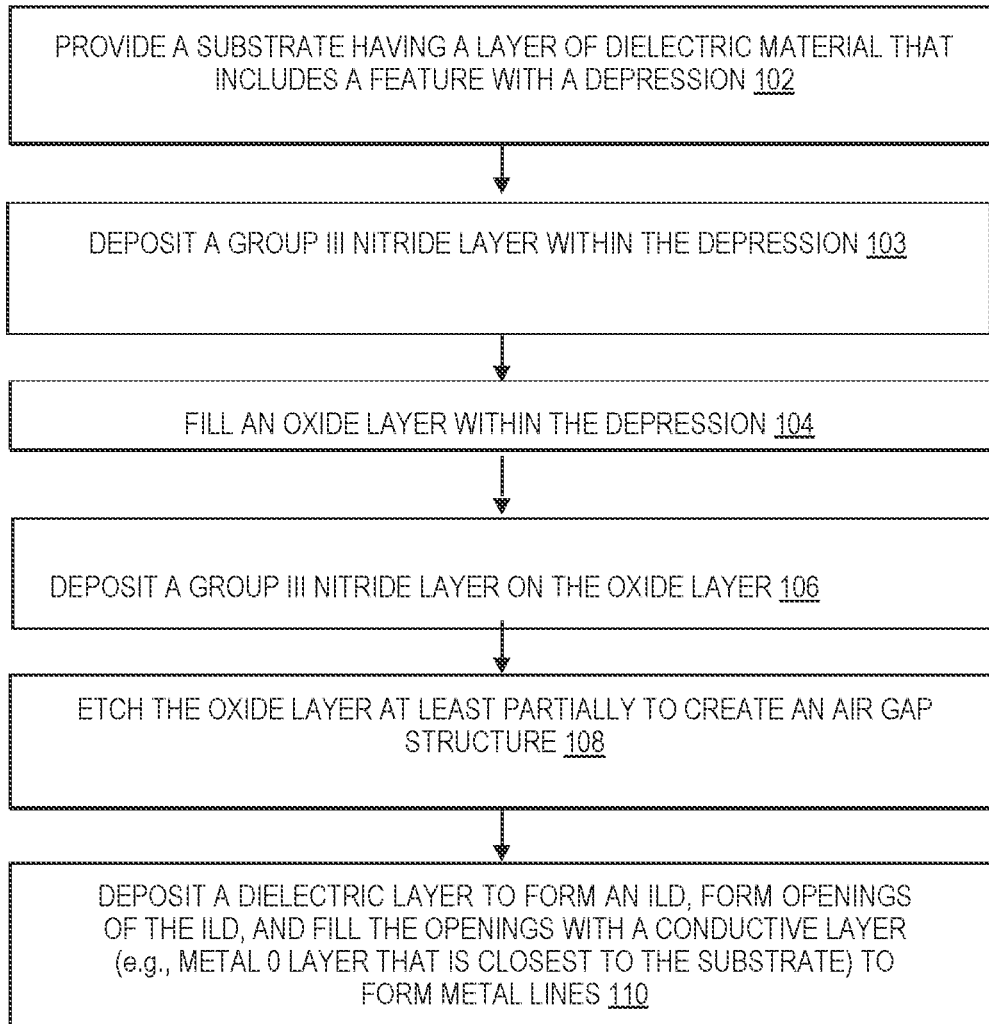
FIG. 1 illustrates a process for fabricating microelectronic devices having air gap structures integrated with interconnect structures for reduced parasitic capacitances in accordance with one embodiment.

Described herein are microelectronic devices having air gap structures integrated with interconnect for reduced parasitic capacitances. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

Electronic connections between the electronic devices (e.g., transistors) in an integrated circuit (IC) chip are currently typically created using copper metal or alloys of copper metal. Devices in an IC chip can be placed not only across the surface of the IC chip but devices can also be stacked in a plurality of layers on the IC chip. Electrical interconnections between electronic devices that make up the IC chip are built using vias and trenches that are filled with conducting material. Layer(s) of insulating materials, frequently, low-k dielectric materials, separate the various components and devices in the IC chip. The substrate on which the devices of the IC circuit chip are built is, for example, a silicon wafer or a silicon-on-insulator substrate. Silicon wafers are substrates that are typically used in the semiconductor processing industry, although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. IC devices that make up the chip are built on the substrate surface.

At least one dielectric layer is deposited on the substrate. Dielectric materials include, but are not limited to, silicon dioxide (SiO2), low-k dielectrics, silicon nitrides, and or silicon oxynitrides. The dielectric layer optionally includes pores or other voids to further reduce its dielectric constant. Typically, low-k films are considered to be any film with a dielectric constant smaller than that of Sift which has a dielectric constant of about 4.0. Low-k films having dielectric constants of about 1 to about 4.0 are typical of current semiconductor fabrication processes. The production of integrated circuit device structures often also includes placing a silicon dioxide film or layer, or capping layer on the surface of low-k (low dielectric constant) ILD (inter-layer dielectric) films. Low-k films can be, for example, boron, phosphorous, or carbon doped silicon oxides. Carbon-doped silicon oxides can also be referred to as carbon-doped oxides (CDOs) and organo-silicate glasses (OSGs).

To form electrical interconnects, dielectric layers are patterned to create one or more trenches and or vias within which metal interconnects will be formed. The terms trenches and vias are used herein because these are the terms commonly associated with the features that are used to form metal interconnects. In general, a feature used to form a metal interconnect is a depression having any shape formed in a substrate or layer deposited on the substrate. The feature is filled with conducting interconnect material. The trenches and or vias may be patterned (created) using conventional wet or dry etch semiconductor processing techniques. Dielectric materials are used to isolate electrically metal interconnects from the surrounding components.

Due to issues with a first metal layer (e.g., metal 0 layer that is positioned closest to a substrate in comparison to other metal layers (e.g., metal 1, metal 2, metal 3) of the metallization stack) routing incurring a largest parasitic capacitance between the metal transmission lines of the first metal layer and a substrate, the present design integrates air gap structures with interconnect structures of microelectronic devices to provide lower Csub capacitance between the metal lines and the substrate. The lower parasitic capacitances of the lowest interconnect metal layer improves efficiency and density of circuitry formed on the microelectronic device.

FIG. 1 illustrates a process for fabricating microelectronic devices having air gap structures integrated with interconnect structures for reduced parasitic capacitances in accordance with one embodiment. In FIG. 1, a substrate having a layer of dielectric material (e.g., ILD) that includes a feature with a depression is provided at operation 102. The depression will be used for forming an air gap structure that is integrated with an electrically conducting interconnect. The depression is typically formed in a dielectric layer, such as an ILD layer through an etching process used in the semiconductor industry. The process including depositing a group III-nitride layer within the depression at operation 103. This deposition can be a blanket deposition and if the III-nitride material only remains in the depression, a polish step may be included subsequent to the deposition of this III-nitride layer. The depression can be filled with a sacrificial oxide layer (e.g., SiO2, SiON, aluminum oxide layer, any type of sacrificial oxide layer) at operation 104. The oxide layer can be deposited selectively in desired regions such as the depressions or the oxide layer can be deposited as a blanket layer on the dielectric layer of the microelectronic device. At operation 106, a group III nitride layer (e.g., AlN, BN, GaN, InN, any combination of group III nitride layers) is deposited on the sacrificial oxide layer. The combination can be a multilayer structure comprising these group III Nitride layers, as well as alloy combination of these layers, for example, $Al_xGa_{1-x}N$ where x is greater than zero but less than 1. This deposition can be a blanket deposition and if the III-nitride material only remains on the oxide layer in the depression, a masking step to mask the depression layer followed by an etch of the III-nitride everywhere else may be included. At operation 108, the sacrificial oxide layer is etched (e.g., selectively wet etched) at least partially to create an air gap structure. A dielectric layer is deposited to form the ILD, openings of the ILD are formed and filled with a first conductive layer (e.g., metal 0 layer that is closest metal layer to the substrate) of a metallization stack to form metal lines at operation 110. The air gap structure is located below the first conductive layer of the metallization stack that includes first and second conductive layers.

Figure 2:
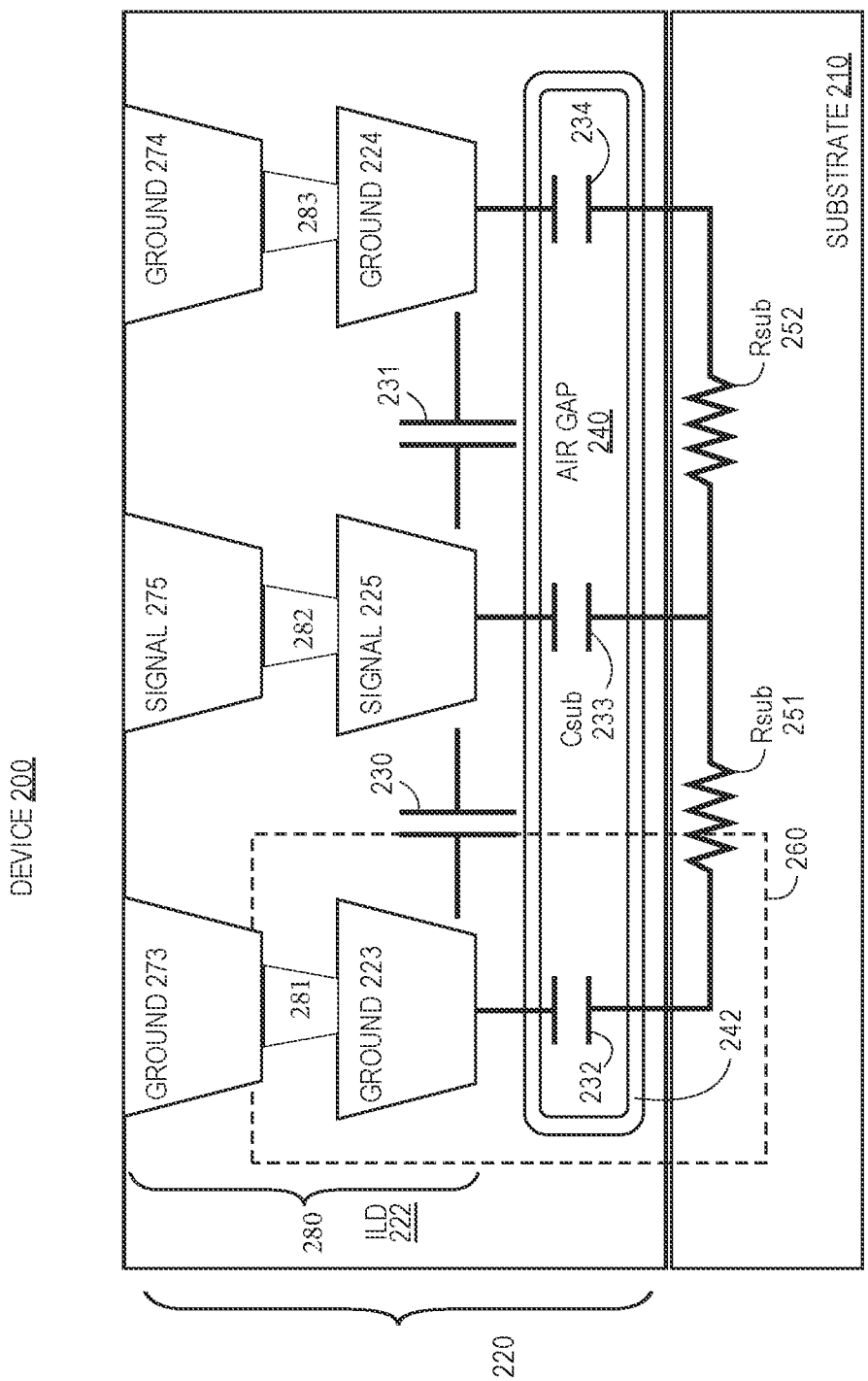
FIG. 2 illustrates a microelectronic device having an air gap structure that is integrated with an electrical interconnect structure of the microelectronic device in accordance with one embodiment to reduce parasitic capacitances.

FIG. 2 illustrates a microelectronic device having an air gap structure that is integrated with an electrical interconnect structure of the microelectronic device in accordance with one embodiment to reduce parasitic capacitances. The device 200 includes a substrate 210, an interconnect structure 220, and dielectric layer(s) 222 (e.g., ILD 222) for electrical isolation between metal ground lines 223-224 and metal transmission line 225 of a first metal layer of a metallization stack 280. The metallization stack 280 includes first metal layer (e.g., lines 223-225) and second metal layer (e.g., ground lines 273-274, transmission line 275). The first metal layer (e.g., metal 0 layer) including lines 223-225 are closest to the substrate among the first and second metal layers of the metallization stack 280. The lines 223-225 are coupled to the lines 273-275, respectively, with electrical connections 281-283 (e.g., vias 281-283). The air gap structure 240 is located below the lines 223-225.

The air gap structure 240 is integrated with the interconnect structure 220 to reduce parasitic capacitances. The air gap structure 240 includes a group III nitride layer 242 (e.g., AlN, BN, GaN, InN, any combination of group III nitride layers) that mechanically supports the film stacks (e.g., ILD 222, metal lines, etc.) that are positioned above the air gap structure 240. The combination can be a multilayer structure comprising these group III Nitride layers, as well as alloy combination of these layers, for example, $Al_xGa_{1-x}N$ where x is greater than zero but less than 1. The group III nitride layer 242 may only include this layer on the top and sidewalls of the air gap structure. In other words, the layer 242 may not be on the bottom of the air gap structure. The device 200 includes Cline capacitances 230 and 231 between metal lines, Csub capacitances 232-234 between metal lines and the substrate 210, and Rsub resistances 251-252. In one embodiment, the air gap structure significantly decreases the Csub capacitances 232-234 (e.g., reduces these capacitances by at least 3.9×). In one example, the air gap structure reduces the Csub capacitances by 3.9× when the air gap has a dielectric constant of approximately 1.0 and the ILD has a dielectric constant of approximately 3.9).

Figure 3:
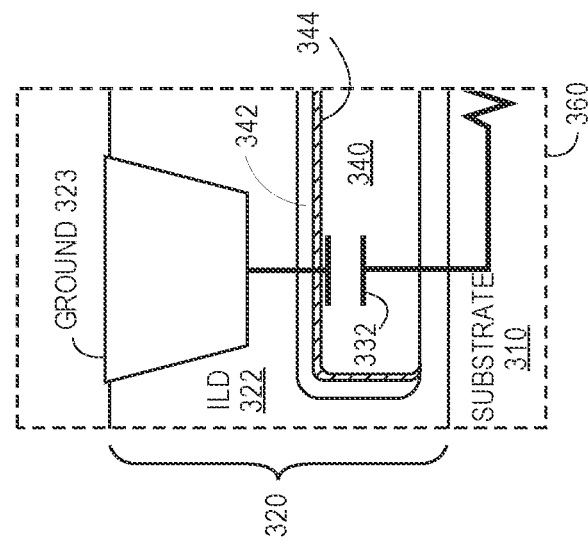
FIG. 3 illustrates a region 360 of a microelectronic device 300 having an air gap structure that is integrated with an electrical interconnect structure in accordance with one embodiment to reduce parasitic capacitances.

FIG. 3 illustrates a region 360 of a microelectronic device 300 having an air gap structure that is integrated with an electrical interconnect structure in accordance with one embodiment to reduce parasitic capacitances. The region 360 is similar to a region 260 of FIG. 2 except that a group III nitride layer 342 is only included on the top and sidewalls of the air gap structure. In other words, the layer 342 may not be on the bottom of the air gap structure. FIG. 3 illustrates a substrate 310, an interconnect structure 320, and dielectric layer(s) 322 (e.g., ILD 322) for electrical isolation between metal ground lines (e.g., 323) and transmission signals of the interconnect structure. The air gap structure 340 is located below the metal line 323 (e.g., metal 0 layer). The air gap structure 340 is integrated with the interconnect structure 320 to reduce parasitic capacitances. The air gap structure 340 includes a group III nitride layer 342 (e.g., AlN, BN, GaN, InN, any combination of group III nitride layers) that mechanically supports the film stacks (e.g., ILD 322, metal lines, film stack having a thickness of 1 to 1.5 microns, etc.) that are positioned above the air gap structure 340. The combination can be a multilayer structure comprising these group III Nitride layers, as well as alloy combination of these layers, for example, $Al_xGa_{1-x}N$ where x is greater than zero but less than 1. The air gap structure 340 may also include a sacrificial oxide layer 344 that is located within the group III nitride layer 342. The sacrificial oxide layer 344 may also be completely etched out and removed from the air gap structure 340. In one embodiment, the air gap structure significantly decreases the Csub capacitance 232 (e.g., reduces this capacitance by at least 3.9×). In one example, the air gap structure reduces the Csub capacitances by 3.9× when the air gap has a dielectric constant of approximately 1.0 and the ILD has a dielectric constant of approximately 3.9). The dimensions of the air gap structure 340 can be determined based on a dimensional scale located near the lower portion of the image 300. The air gap structure 340 may have a width to height ratio from 1:1 to 20:1. In one example, the group III nitride layer 342 has a thickness of 50 to 250 nanometers and the sacrificial oxide layer 344 has an initial thickness of 50 to 500 nanometers. The air gap structure 340 may include air, any gas, and any porous dielectric material.

Figure 4:
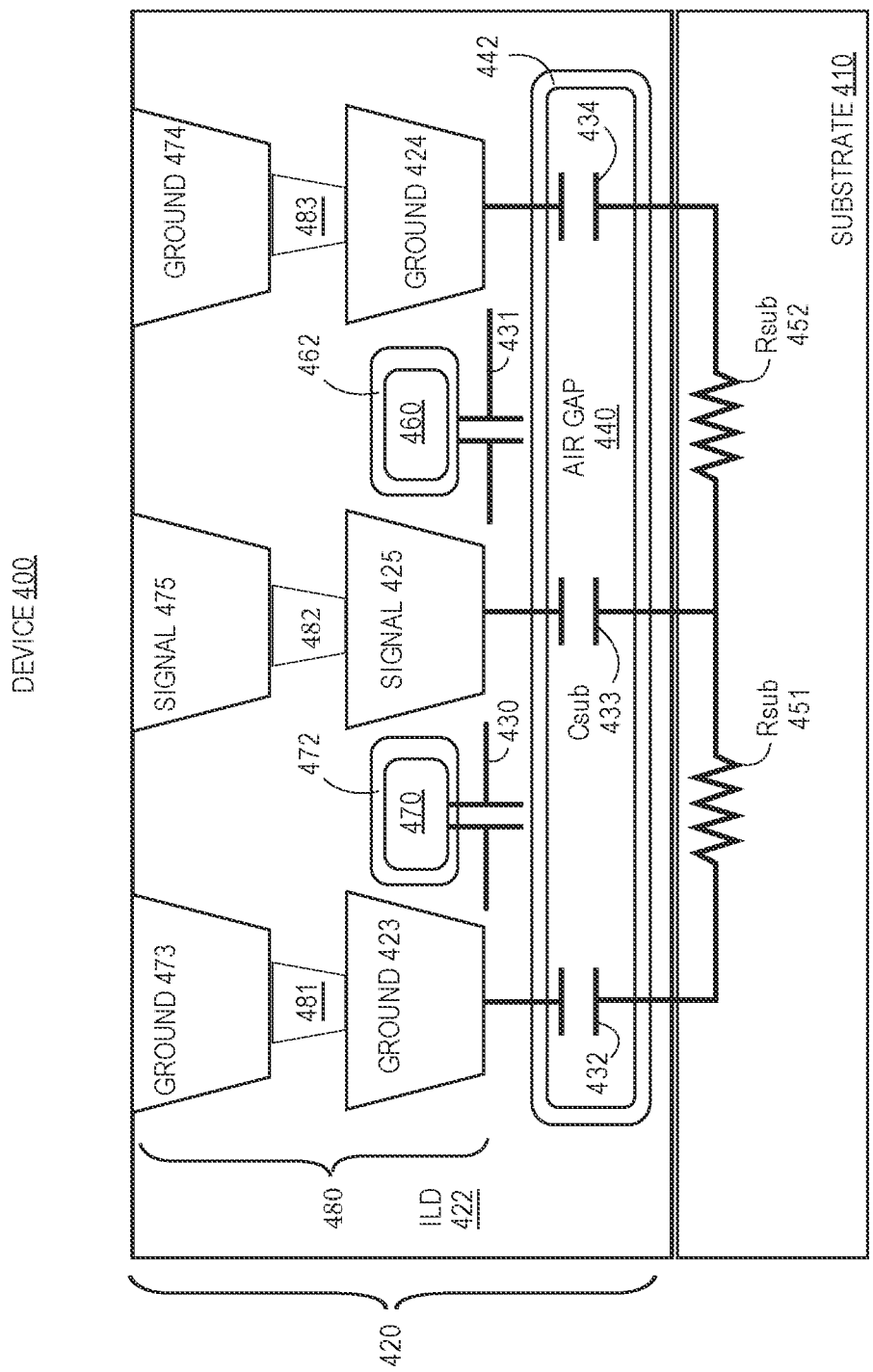
FIG. 4 illustrates a microelectronic device having an air gap structure that is integrated with an electrical interconnect structure of the microelectronic device in accordance with one embodiment to reduce parasitic capacitances.

FIG. 4 illustrates a microelectronic device having an air gap structure that is integrated with an electrical interconnect structure of the microelectronic device in accordance with one embodiment to reduce parasitic capacitances. The device 400 includes a substrate 410, an interconnect structure 420, and dielectric layer(s) 422 (e.g., ILD 422) for electrical isolation between metal ground lines 423-424 and transmission signal 425 of a first metal layer of a metallization stack 480. The metallization stack 480 includes first metal layer (e.g., lines 423-425) and second metal layer (e.g., ground lines 473-474, transmission line 475). The first metal layer (e.g., metal 0 layer) including lines 423-425 are closest to the substrate among the first and second metal layers of the metallization stack 480. The lines 423-425 are coupled to the lines 473-475, respectively, with electrical connections 481-483 (e.g., vias 481-483). The air gap structure 440 is located below the lines 423-425.

Air gap structures 440, 460, and 470 are integrated with the interconnect structure 420 to reduce parasitic capacitances. The air gap structure 440 includes a group III nitride layer 442 (e.g., AlN, BN, GaN, InN, any combination of group III nitride layers) that mechanically supports the film stacks (e.g., ILD 422, metal lines, etc.) that are positioned above the air gap structure 440. The combination can be a multilayer structure comprising these group III Nitride layers, as well as alloy combination of these layers, for example, $Al_xGa_{1-x}N$ where x is greater than zero but less than 1. The air gap structure 460 includes a group III nitride layer 462 (e.g., AlN, BN, GaN, InN, any combination of group III nitride layers) that mechanically supports the film stacks (e.g., ILD 422, metal lines, etc.) that are positioned above the air gap structure 460. The air gap structure 470 includes a group III nitride layer 472 (e.g., AlN, BN, GaN, InN, any combination of group III nitride layers) that mechanically supports the film stacks (e.g., ILD 422, metal lines, etc.) that are positioned above the air gap structure 470.

The group III nitride layers 442, 462, and 472 may only include this respective layer on the top and sidewalls of the air gap structure. In other words, these group III nitride layers may not be on the bottom of the respective air gap structure. The device 400 includes Cline capacitances 430 and 431 between metal lines, Csub capacitances 432-434 between metal lines and the substrate 410, and Rsub resistances 451-452. In one embodiment, the air gap structure 440 significantly decreases the Csub capacitances 432-434 (e.g., reduces these capacitances by at least 3.9×). In one example, the air gap structure 440 reduces the Csub capacitances by 3.9× when the air gap has a dielectric constant of approximately 1.0 and the ILD has a dielectric constant of approximately 3.9).

In another embodiment, the air gap structures 460 and 470 significantly decrease the Cline capacitances 430-431 (e.g., reduces these capacitances by at least 3.9×). In one example, the air gap structures 460 and 470 reduce the Cline capacitances by 3.9× when the air gap has a dielectric constant of approximately 1.0 and the ILD has a dielectric constant of approximately 3.9).

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 5:
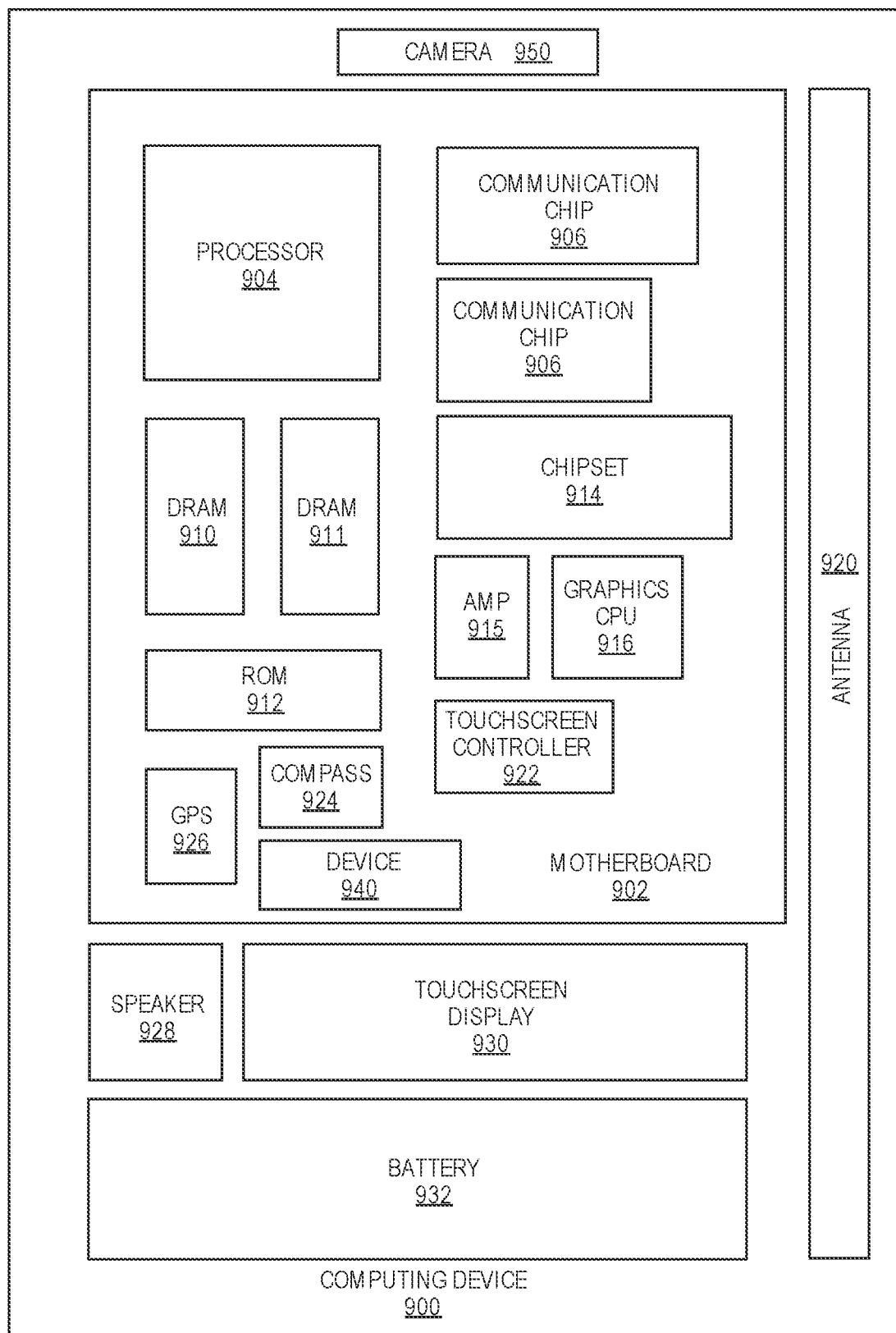
FIG. 5 illustrates a computing device 900 in accordance with one embodiment of the invention.

FIG. 5 illustrates a computing device 900 in accordance with one embodiment of the invention. The computing device 900 houses a board 902. The board 902 may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, any of the components of the computing device include at least one microelectronic device (e.g., microelectronic device 200, 400) having interconnect structures (e.g., interconnect structure 220, 420) with integrated air gap structures (e.g., air gap structure 240, 440, 460, 470). The computing device 900 may also include a separate microelectronic device 940 (e.g., microelectronic device 200, 400).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some implementations of embodiments of the invention, the integrated circuit die of the processor includes one or more devices, such as microelectronic devices (e.g., microelectronic device 200, 400, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 200, 400, etc.).

The following examples pertain to further embodiments. Example 1 is a microelectronic device that includes a substrate, at least one dielectric layer on the substrate, a plurality of conductive lines within the at least one dielectric layer, and an air gap structure that is located below two or more of the plurality of conductive lines. The air gap structure reduces parasitic capacitances between the conductive layer and the substrate.

In example 2, the subject matter of example 1 can optionally include the air gap structure comprising a group III Nitride layer formed on an upper region and sidewalls of the air gap structure.

In example 3, the subject matter of any of examples 1-2 can optionally include a metallization stack that includes first and second metal layers with the plurality of conductive lines being at the first metal layer of the metallization stack. The first metal layer is closest to the substrate among the first and second metal layers of the metallization stack.

In example 4, the subject matter of any of examples 1-3 can optionally include the group III Nitride layer comprising an Aluminum Nitride layer, a Boron Nitride layer, a Gallium Nitride layer, an Indium Nitride layer, or any combination of these group III Nitride layers.

In example 5, the subject matter of any of examples 1-4 can optionally include the group III Nitride layer having a thickness of 50 to 250 nanometers.

In example 6, the subject matter of any of examples 1-5 can optionally include the substrate comprising a Silicon substrate.

In example 7, the subject matter of any of examples 1-6 can optionally include the air gap structure comprising an air gap having a dielectric constant of approximately 1.0.

In example 8, the subject matter of any of examples 1-7 can optionally include the air gap structure having a substantially rectangular shape or a substantially trapezoidal shape.

Example 9 is an interconnect structure comprising at least one dielectric layer and a conductive layer having a plurality of conductive lines within the at least one dielectric layer. At least one air gap structure is integrated with the interconnect structure. The at least one air gap structure is positioned between adjacent conductive lines of the plurality of conductive lines. Each air gap structure reduces parasitic capacitance between conductive lines that are adjacent to a respective air gap structure.

In example 10, the subject matter of example 9 can optionally include the at least one air gap structure comprising a group III Nitride layer formed on an upper region and sidewalls of the at least one air gap structure.

In example 11, the subject matter of any of examples 9-10 can optionally include a metallization stack that includes first and second metal layers with the plurality of conductive lines being at the first metal layer of the metallization stack. The first metal layer is closest to the substrate among the first and second metal layers of the metallization stack.

In example 12, the subject matter of any of examples 9-11 can optionally include the group III Nitride layer comprising an Aluminum Nitride layer, a Boron Nitride layer, a Gallium Nitride layer, an Indium Nitride layer, or any combination of these group III Nitride layers.

In example 13, the subject matter of any of examples 9-12 can optionally include the group III Nitride layer having a thickness of 50 to 250 nanometers.

In example 14, the subject matter of any of examples 9-13 can optionally include the interconnect structure being disposed on a substrate to form a microelectronic device.

In example 15, the subject matter of any of examples 9-14 can optionally include each air gap structure comprising an air gap having a dielectric constant of approximately 1.0.

In example 16, the subject matter of any of examples 9-15 can optionally include each air gap structure having a substantially rectangular shape or a substantially trapezoidal shape.

Example 17 is a method that includes providing a substrate having a layer of dielectric material that includes a feature with a depression, filling an oxide layer within the depression, depositing a group III nitride layer on the oxide layer, and etching the oxide layer at least partially to create an air gap structure.

In example 18, the subject matter of example 17 can optionally include depositing a dielectric layer to form inter-layer dielectric (ILD), forming openings within the ILD, and forming a first conductive layer of a metallization stack within the openings to form metal lines of the metallization stack. The air gap structure is located below the first conductive layer of the metallization stack that includes first and second conductive layers.

In example 19, the subject matter of any of examples 17-18 can optionally include the group III Nitride layer comprising an Aluminum Nitride layer, a Boron Nitride layer, a Gallium Nitride layer, an Indium Nitride layer, or any combination of these group III Nitride layers.

Example 20 is a computing device comprising a processor to process data and a microelectronic device coupled to the processor. The microelectronic device includes a substrate, at least one dielectric layer disposed on the substrate, a conductive layer having a plurality of conductive lines within the at least one dielectric layer, and an air gap structure that is located below two or more of the plurality of conductive lines. The air gap structure to reduce parasitic capacitances between the conductive layer and the substrate.

In example 21, the subject matter of example 20 can optionally include the air gap structure comprising a group III Nitride layer formed on an upper region and sidewalls of the air gap structure.

In example 22, the subject matter of any of examples 20-21 can optionally include the group III Nitride layer provides mechanical support for the air gap structure.

The invention claimed is:

1. An interconnect structure comprising:
   at least one dielectric layer and a conductive layer having a plurality of conductive lines within the at least one dielectric layer;
   a first air gap structure that is integrated with the interconnect structure, the first air gap structure positioned between first and second adjacent conductive lines of the plurality of conductive lines, wherein the first air gap structure comprises a group III Nitride layer formed on a region of the first air gap structure; and
   a second air gap structure below the first and second adjacent conductive lines of the plurality of conductive lines, the second air gap structure comprising a continuous air gap vertically beneath the the first and second adjacent conductive lines of the plurality of conductive lines.

2. The interconnect structure of claim 1, further comprising:
   a metallization stack that includes first and second metal layers with the plurality of conductive lines being at the first metal layer of the metallization stack.

3. The interconnect structure of claim 1, wherein the group III Nitride layer comprises an Aluminum Nitride layer, a Boron Nitride layer, a Gallium Nitride layer, an Iridium Nitride layer, or any combination of these group III Nitride layers.

4. The interconnect structure of claim 1, wherein the group III Nitride layer has a thickness of 50 to 250 nanometers.

5. The interconnect structure of claim 1, wherein the interconnect structure is disposed on a substrate to form a microelectronic device.

6. The interconnect structure of claim 1, wherein the region is an upper region and sidewalls of the first air gap structure.

7. The interconnect structure of claim 1, wherein each air gap structure has a substantially rectangular shape or a substantially trapezoidal shape.

* * * * *